United States Patent [19]

Schröder et al.

[11] 4,321,482

[45] Mar. 23, 1982

[54] CIRCUIT SYSTEM FOR THE GENERATION OF A DIRECT CONTROL VOLTAGE WHICH IS DEPENDENT ON AN ALTERNATING VOLTAGE

[75] Inventors: Ernst Schröder, Hanover; Jürgen Wermuth, Stederdorf, both of Fed. Rep. of Germany

[73] Assignee: Licentia Patent-Verwaltungs-G.m.b.H., Frankfurt am Main, Fed. Rep. of Germany

[21] Appl. No.: 56,971

[22] Filed: Jul. 11, 1979

[30] Foreign Application Priority Data

Jul. 13, 1978 [DE] Fed. Rep. of Germany ....... 2830784

[51] Int. Cl.³ .................. H03K 5/159; H03K 5/00
[52] U.S. Cl. ............................ 307/262; 307/352; 307/360
[58] Field of Search ............ 307/352, 360, 260; 333/14; 330/278–285; 455/72

[56] References Cited

U.S. PATENT DOCUMENTS 3,488,604  1/1970  Smilowitz .................. 330/279
3,862,437  1/1975  Rossell ...................... 307/352
3,969,680  7/1976  Wermuth .................... 333/14

FOREIGN PATENT DOCUMENTS 1488421  10/1977  United Kingdom .

Primary Examiner—Larry N. Anagnos
Assistant Examiner—B. P. Davis
Attorney, Agent, or Firm—Spencer & Kaye

[57] ABSTRACT

In a circuit system for the generation of a direct control voltage dependent upon an alternating voltage for a dynamic compander device, the system including a charging capacitor, a charging circuit connected to charge the capacitor, and a circuit connected to discharge the capacitor, a comparator unit is connected to effect comparison between the alternating voltage and a reference voltage and to produce an output voltage representative of the amount by which the alternating voltage exceeds the reference voltage, and at least one of the circuits is formed of a current source and an electronically controllable current path connected between the source and the capacitor and having a control input connected to the comparator unit for varying the conductance of the current path as a function of the output voltage of the comparator unit.

10 Claims, 3 Drawing Figures

CIRCUIT SYSTEM FOR THE GENERATION OF A DIRECT CONTROL VOLTAGE WHICH IS DEPENDENT ON AN ALTERNATING VOLTAGE

BACKGROUND OF THE INVENTION

The invention relates to a circuit system for the generation of a direct control voltage which is dependent upon an alternating voltage and composed of a charging circuit which can be charged through one circuit path and discharged through another circuit path.

The use of such a circuit system as a control voltage generator in a compander system has been previously disclosed in the German patent specification No. 24 06 258 and counterpart U.S. Pat. No. 3,969,680.

Into the input of the control voltage generator is fed, on compression, the alternating voltage output signal and, on expansion, the alternating voltage input signal from an amplifier with electronically controllable amplification located in the useful signal path is fed to the control voltage generator input via another electronically controllable amplifier. The direct voltage output signal from the control voltage generator is fed both into the control input of the amplifier located in the useful signal path and into the control input of the other amplifier. In this context the action of the control voltage generator is such that when a threshold value is exceeded, the generator produces a steeply rising direct voltage through the alternating voltage fed into the input of the control voltage generator. This steeply rising direct voltage varies the amplification of the amplifier in the useful signal path until the alternating current at the input of the control voltage generator has dropped back again below the aforesaid threshold value.

A rapid variation of the transmission factor of the amplifiers located in the signal path is of importance specifically when the level of the useful signals varies in jumps over large ranges. Otherwise there exists, in the case of a jump in level from a small to a large value, the risk of overshooting and thereby overdriving of the transmission channel. Noise signals would become audible during the transition time of re-adjustment in cases of jumps in levels in the reverse direction.

The control voltage generator for the control of the transmission factor of the amplifiers located in the useful signal path must therefore furnish a direct control voltage which is rapidly adapted to the momentary level of the useful signal. A condition for this is a short charging or discharging time constant effective on the occurrence of large jumps in levels at the charging capacitor of the control voltage generator. Such a short time constant can be achieved through appropriate rating of the charging or discharging current source.

In the stationary state or during slow level variations the charging or discharging time constant must however be large so that the direct control voltage does not vary in the rhythm of the useful signal frequency. Such a behavior would produce a large non-linear distortion factor.

The result of these considerations is that two contradictory requirements have to be met when fixing the charging and discharging time constants for the control voltage generator. One compromise for a solution is the variation of the discharging and charging time constants as a function of the jumps in level of the useful signal.

The adaptation of the charging and discharging time constants can be achieved through the duty factor, or duration of activation, of a switch located in the charging or discharging current path. The duty factor could in this context be rated in accordance with the time during which a useful signal exceeds in the comparator the limits preset by reference voltages. This time represents at small excursions, an accurate measure for the extent of the excursion, i.e. the ratio between the useful signal amplitude and the reference voltage. This time increases however only little at large excursions so that any assignment of duration of excursion and extent of excursion becomes inaccurate. This approach is technically difficult to master.

SUMMARY OF THE INVENTION

The object of the invention is the provision of a circuit system by which it is possible to generate a control voltage which is clearly assigned over the full level range of the useful signal to the momentary level of the useful signal and the transfer time constant of which is controlled by the jumps in levels.

This and other objects are achieved, according to the invention, in a circuit system for the generation of a direct control voltage dependent upon an alternating voltage for a dynamic compander device, the system including a charging capacitor, a charging circuit connected to charge the capacitor, and a circuit connected to discharge the capacitor, by the provision of comparator means connected to effect comparison between the alternating voltage and a reference voltage and to produce an output voltage representative of the amount by which the alternating voltage exceeds the reference voltage, and by constituting at least one of the circuits of a current source and an electronically controllable current path connected between the source and the capacitor and having a control input connected to the comparator means for varying the conductance of the current path as a function of the output voltage of the comparator means.

BRIEF DESCRIPTION OF THE DRAWINGS

The invention will now be explained in greater detail on examples of embodiments which are shown in the drawing. The various diagrams in the drawing show the following.

DESCRIPTION OF THE PREFERRED EMBODIMENTS

Figure 1:
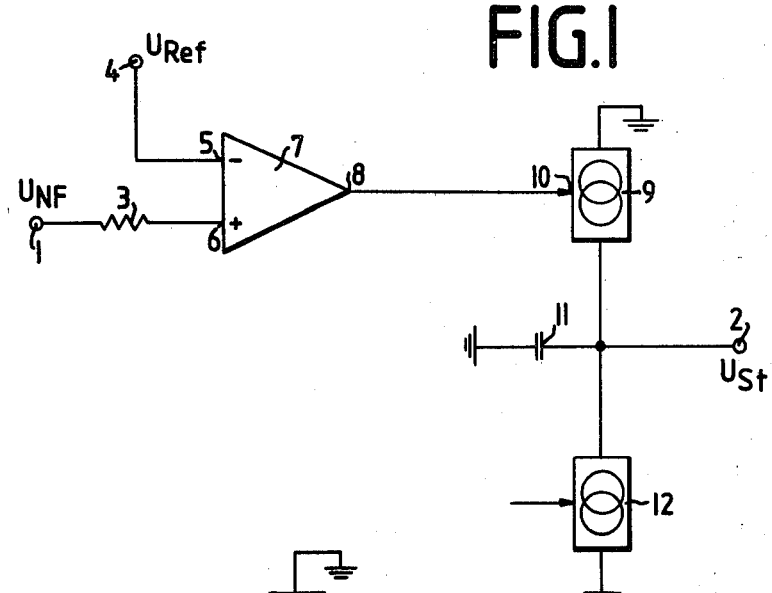
FIG. 1 shows the basic structure of the circuit in accordance with the invention.

FIG. 1 shows the basic structure of the circuit in accordance with the invention. A circuit of this kind can be typically employed as control voltage generator in the function blocks designated with 5 of the circuits shown in FIGS. 1 and 2 of the German patent specification 24 06 258 and U.S. Pat. No. 3,969,680 mentioned at the beginning.

The circuit in accordance with the invention has an input 1 for the alternating voltage $U_{NF}$ and an output 2 for the direct control voltage $U_{St}$. The input 1 is connected through a resistance 3 with a non-inverting input 6 of a differential amplifier 7. A reference voltage $U_{Ref}$ is fed through the input terminal 4 into the inverting input 5. The differential amplifier acts as comparator and supplies an output voltage the value of which is a function of the amount by which the alternating input voltage $U_{NF}$ exceeds the reference voltage $U_{Ref}$. The output 8 of the differential amplifier 7 is connected with a control input 10 of an electrically controllable current path with a current source 9 which is used for the charging of a charging capacitor 11. A reference voltage (ground) is applied to the other contact of the charging capacitor 11. The charging voltage at the charging capacitor 11 can be tapped through an output terminal 2. The common junction of the electronically controllable current source, of the charging capacitor 11 and the output terminal 2 is connected by means of another current path with a current source 12. In the case in which the controllable current source 9 serves as a charging current source the current source 12 will act as discharge current source. The reverse case is also possible. In a practical form of embodiment it would be expedient to design the current source 12 in the form of a controllable current source. The triggering will be explained later in connection with a further preferred embodiment.

The circuit system is suitable for use as control voltage generator for compander systems which feed an alternating voltage signal with constant dynamics to the control voltage generator in the stationary state and which only produce in the case of amplitude jumps at the input side a short period variation in amplitude which is however then restored to the stationary value by the control circuit. In the stationary state there will be set up at the input terminal 1 a peak value of the alternating input voltage $U_{NF}$ which exceeds the value of the reference voltage $U_{Ref}$ existing at the terminal 4. For the duration of this excursion, or voltage difference there will then be fed into the control input 10 of the controllable current source 9 an output voltage from the differential amplifier 7 which is analogous to the extent of the voltage difference, i.e. the ratio of the instantaneous value of the alternating voltage to the value of the reference voltage. A charging current flows into the charging capacitor 11 through the controllable current source 9 and in the stationary state this charging current just compensates the charge which drains away through the current source 12.

Figure 2:
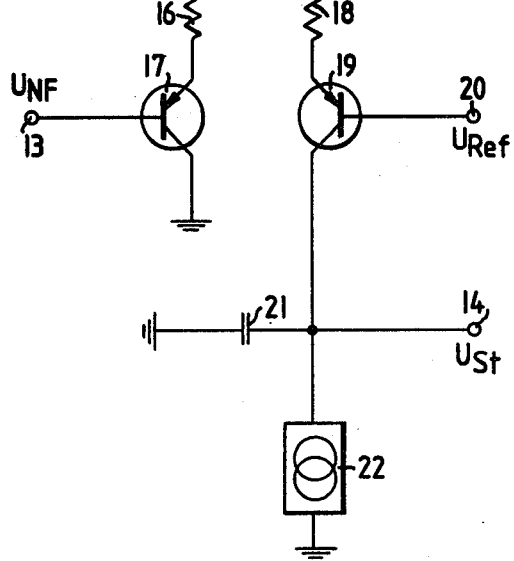
FIG. 2 shows a first preferred embodiment of the circuit in accordance with the invention.

FIG. 2 shows an example of a first preferred embodiment of the circuit in accordance with the invention. This circuit also comprises an input 13 for the alternating voltage $U_{NF}$ and an output 14 for the direct control voltage $U_{St}$. To the output terminal 14 is connected a charging capacitor 21 which can be charged through a charging current path comprising a transistor 19, a resistor 18 and a current source 15 and can be discharged through a discharge current path with the current source 22. A comparator is constituted by a degeneratively coupled differential amplifier consisting of two transistors 17, 19, and two emitter resistances 16, 18, cooperating with the current source 15. The base of the first transistor 17 is connected with the input terminal 13. The alternating voltage $U_{NF}$ is fed into this base. The base of the second transistor 19 is connected through an input terminal 20 with a reference voltage source $U_{Ref}$. The collector of the first transistor 17 is subject to a reference voltage (ground), and the collector of the second transistor is connected with the common junction of the charging capacitor 21. The emitters of the two transistors 17, 19 are connected with one another via the two emitter resistances 16, 18. The current source 15 is connected to the common junction.

The transistors 17 and 19 act as controlled current distributors. The transistor 17 is advance controlled in the case in which the instantaneous value of the alternating voltage is extremely small. The current supplied by the current source 15 passes therefore only through the resistance 16 and the emitter-collector section of the first transistor 17. A current in the emitter-collector sections begin to flow when the instantaneous value of the alternating voltage exceeds the value of the reference voltage $U_{Ref}$ minus the maximum voltage drop at the emitter resistor 16 ($U_{Ref}-I_{15}\cdot R_{16}$). The current passing through the transistor 19 will steadily increase with increasing instantaneous value $U_{NF}$. The current attains its maximum when the instantaneous value of the alternating voltage $U_{NF}$ exceeds the value of the reference voltage $U_{Ref}$ plus the maximum voltage drop at the emitter resistance 18 ($-U_{Ref}+I_{15}\cdot R_{18}$). In this operating case the maximum current supplied by the current source 15 is used for the charging of the capacitor 21.

The range of control for the magnitude of the charging current as a function of the input voltage $U_{NF}$ can be set through appropriate rating of the maximum magnitude of the current furnished by the current source 15 and the values of the emitter resistances 16, 18. In this context a range of 10 dB is beneficial between the amplitude which results in a maximum charging current and the amplitude which allows a charging current to just flow. A proportional control of the control current as a function of the extent of excursion of the alternating voltage from $U_{Ref}$ is found to be advantageous within this range.

Figure 3:
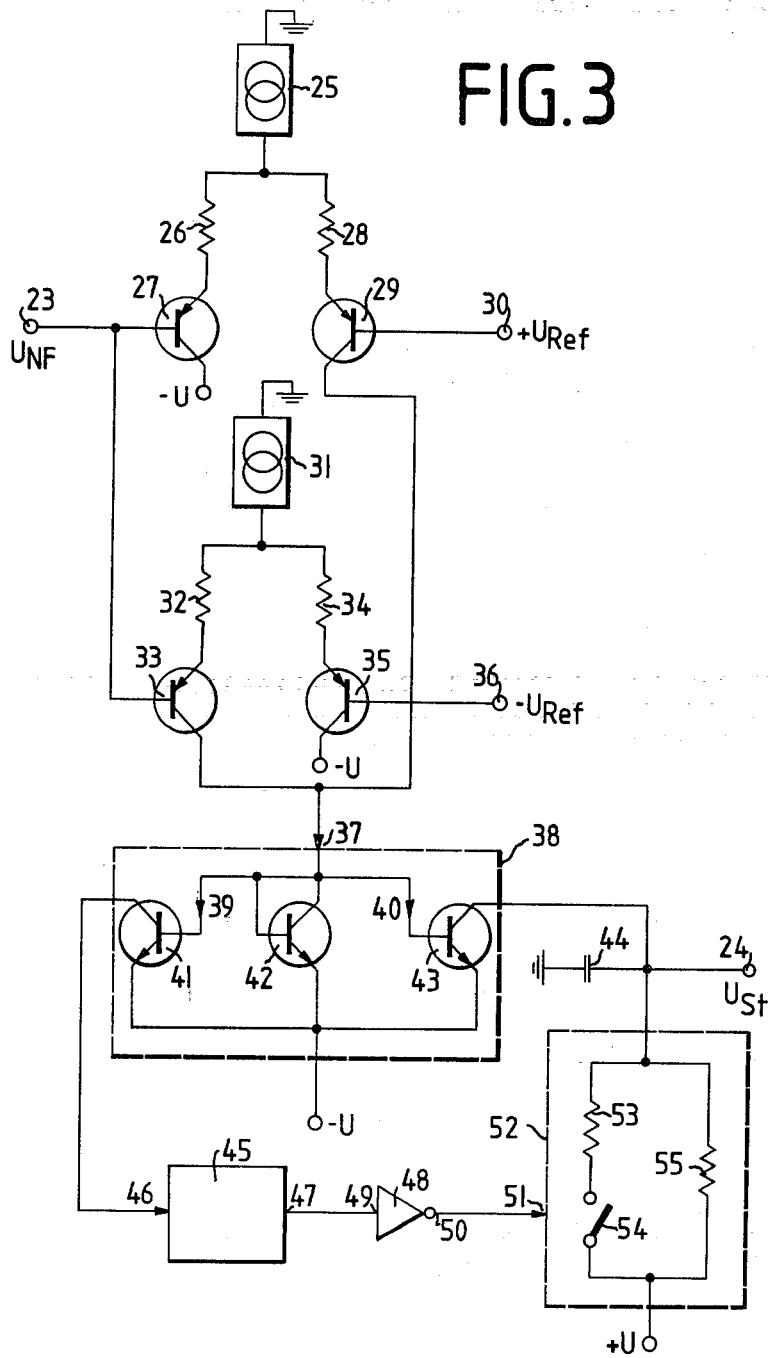
FIG. 3 shows a further preferred embodiment of the circuit in accordance with the invention with comparators for the positive and negative half-wave of the useful alternating voltage.

FIG. 3 shows a further preferred embodiment of the circuit in accordance with the invention. In contrast to the form of embodiment shown in FIG. 2 this circuit is equipped with comparators for comparing the positive and negative half-waves of the alternating input voltage with reference voltages. The alternating voltage signals $U_{NF}$ are fed into one input terminal 23 and a control voltage $U_{St}$ can be tapped at an output terminal 24.

The comparators for the positive and negative half-waves consist of identically designed differential amplifiers which each cooperate with one current source. The comparator for positive half-waves comprises two transistors 27 and 29 and two emitter resistances 26 and 28, cooperating with a current source 25. The comparator for the negative half-waves comprises two transistors 33 and 35 and two emitter resistances 33 and 34, cooperating with a current source 31. The emitters of the transistors of both comparators are connected through the emitter resistances 26, 28 or 32, 34 with a junction with the appropriate current source 25 or 31. The alternating voltage signals are fed through the input terminal 23 to the bases of the first transistors 27, 33. The base of the second transistor 29 of the comparator for the positive half-waves is connected through an input terminal 30 with a positive reference voltage source, while the base of the second transistor 35 of the comparator for the negative half-waves is connected with an input terminal 36 for the negative reference voltage. In the case of the comparator for the positive half-waves the collector of the first transistor and in the case of the comparator for the negative half-waves the collector of the second transistor is connected with a reference voltage ($-U$). The collectors of the other two transistors 29, 33 are connected with one another and with an input 37 of a current level circuit 38 comprising the transistors 41, 42 and 43. The base connections of the transistors 41 and 43 are designated as control inputs 39 and 40. The bases of the transistors 41, 42, 43 and the collector of the transistor 42 are connected with the control input 37 of the current level circuit 38. The emitters of the transistors 41, 42, 43 are connected with one another and are connected to a reference voltage ($-U$). The collector of the transistor 43 is connected with a charging capacitor 44. The transistor 43 acts as electronically controllable charging current path for this charging capacitor. The other connection of the charging capacitor 44 is connected to a reference voltage (ground). The charging voltage of the charging capacitor 44 can be tapped through the output terminal 24. The discharge of the charging capacitor 44 is effected through a further electronically controllable current path 52, which connects with the common junction of the charging capacitor 44, the collector of the transistor 43 and the output terminal 24 and whose other connection is connected with a reference voltage ($+U$). The electronically controllable discharge current path 52 is made up from two separate parallel current paths with a resistance 55 and a cascade connection comprising a resistance 53 and a switch 54. The electronically controllable discharge current path 52, specifically the switch 54, is controlled by a control section comprising the transistor 41, a time-lag circuit 45 and an inverter 48. The collector of the transistor 41 in this is connected with a control input 46 of the time-lag circuit 45. The output 47 of the time-lag circuit 45 is connected with the input 49 of an inverter 48, and the output 50 of the inverter 48 is connected with a control input 51 of the electronically controllable discharge current path 52. The time-lag circuit 45 is beneficially designed in the form of a current controlled post-triggerable monostable sweep step.

The mode of operation of the comparators in this circuit does not basically differ from the one shown in FIG. 2. The transistor 29 or 33 supplies a current directly when the instantaneous value of the alternating input voltage $U_{NF}$ exceeds the value of the positive reference voltage minus the maximum voltage drop at the emitter resistance 26 ($U_{Ref} - I_{25} \cdot R_{26}$) or when the instantaneous value falls below the negative reference voltage plus the maximum voltage drop at the emitter resistance 34 ($-U_{Ref} + I_{31} \cdot R_{34}$). The current supplied by the transistor 29 or 33 is fed into the input 37 of the current level circuit 38. A circuit of this kind normally employed in IC-engineering is used for employing a control current for controlling one or several further currents in the ratio 1:1. The controlled currents represent in magnitude an exact copy of the control current. In the present case the same current flows in the collectors of the transistors 41 and 43 as is fed into the control input 37 of the current level circuit 38. This renders it possible, with the control current from the collectors of the transistors 29 and 33, to both control the charging current for the charging capacitor 44 through the transistor 43 and also to trigger the time-lag circuit 45 through the transistor 41.

The above mentioned instantaneous values of the alternating input voltage represent the threshold values at which a charging current begins to pass into the capacitor 44. These threshold values are in the stationary state just exceeded by the peaks of the instantaneous values of the alternating input voltage. The charging current passing periodically into the charging capacitor 44 then just compensates the discharge current so that a constant control voltage $U_{St}$ can be tapped at the charging capacitor.

The threshold values preset by the reference voltages will be greatly exceeded in the event of a sudden increase in level. The effect of this is that an increased control voltage passes to the control input 37 whereupon the charging current path with the transistor 43 supplies an increased charging current. The circuit is preferably rated so that the charging current which flows is proportional to the ratio of the instantaneous value of the alternating input voltage and the above stated threshold values.

The charging voltage at the charging capacitor 44 determining the transfer constant of the controllable amplifiers is adapted to the increased alternating voltage level by variation of the charging time constant in the described manner. This avoids any overshooting which may result in the overdriving of the transfer (transmission) channel the extent of the dynamics of which is limited.

Since, among other things, the amplitude jumps of the alternating voltage serve as control parameters it is possible to achieve a swift assignment between the transfer constant of the amplifiers and the useful signal level over a large level range with good accuracy.

The time-lag circuit 45 designed advantageously in the form of a current controlled post-triggerable monostable sweep step is also triggered by means of the transistor 41 through signals fed to the control input 37. The time-lag circuit 45 trips into an instable state when the control current passing into the input 46 of the time-lag circuit 45 exceeds a preset threshold. The output signal from the time-lag circuit inverted by the inverter 48 effects opening of the switch 54 as a result of which the electronically controllable current source 52 furnishes only a small discharge current.

For the case that the instantaneous values of the alternating input voltage $U_{NF}$ no longer reach the above given threshold values the time-lag circuit 45 maintains its instable state for a predetermined delay time. After lapsing of this delay time the switch 54 is closed and the current source 52 supplies a larger discharge current. In the shown practical form of embodiment the current source is beneficially switched over between two magnitudes of current. This circuit provides two discharge time constants. It is also conceivable to use current sources with a transistor triggered in different ways instead of the current source 52.

The action of the time-lag circuit located in the control branch of the discharge circuit achieves that after a rapid fall-off of the alternating input voltage the dying down of the useful signal cannot be falsified by a likewise rapid variation of the transfer constant. On the other hand the transfer constant of the controllable amplifier will be varied after lapsing of the time-lag time well in time so that no disturbing noises will be noticed.

The terms "charging" and "discharging" are not confined to the case shown in the example of embodiment per FIG. 3 consisting of a negative increase in potential or positive fall in potential at the charging capacitor 44. A potential variation in the reverse sense is also included, which e.g. can be realised through use of complementary transistors and inverted operating voltages in the case of circuits per FIG. 3.

We claim:
1. In a circuit system for the generation of a direct control voltage dependent upon an alternating voltage for a dynamic compander device, the system including a charging capacitor, a charging circuit connected to charge the capacitor, and a circuit connected to discharge the capacitor, the improvement comprising comparator means connected to effect comparison between the alternating voltage and a reference voltage and to produce an output voltage representative of the amount by which the alternating voltage exceeds the reference voltage, and wherein one of said circuits comprises a current source and an electronically controllable current path connected between said source and said capacitor and having a control input connected to said comparator means for varying the conductance of said current path as a function of the output voltage of said comparator means, and the other of said circuits comprises a current source and an electronically controllable current path connected between its said source and said capacitor and having a control input connected to said comparator means.

2. Circuit system as defined in claim 1 wherein said comparator means comprise two comparators each connected to effect comparison between the alternating voltage and a respective reference voltage, and linkage means linking the outputs of said two comparators to provide the output voltage of said comparator means.

3. Circuit system as defined in claim 2 wherein one said comparator compares each positive half-wave of the alternating voltage with a respective reference voltage and the other said comparator compares each negative half-wave of the alternating voltage with a respective reference voltage.

4. Circuit system as defined in claim 3 wherein the respective reference voltages are of equal magnitude and opposite polarities.

5. Circuit system as defined in claim 3 wherein each comparator comprises two transistors connected to constitute a differential amplifier, means supplying the respective reference voltage to the base of one said transistor, and means supplying alternating voltage to the base of the other said transistor.

6. Circuit system as defined in claim 5 wherein said controllable current path is constituted by the emitter-collector path of one of said transistors.

7. Circuit system as defined in claim 1 further comprising means including a time-lag circuit connected between said comparator means and the control input of one of said current paths for causing the conductances of said current paths to be varied in mutually opposite directions.

8. Circuit system as defined in claim 7 wherein said time-lag circuit comprises a post-triggerable monostable sweep step.

9. In a circuit system for the generation of a direct control voltage dependent upon an alternating voltage for a dynamic compander device, the system including a charging capacitor, a charging circuit connected to charge the capacitor, and a circuit connected to discharge the capacitor, the improvement comprising a first comparator connected to effect comparison between each positive half-wave of the alternating voltage and a first reference voltage, a second comparator connected to effect comparison between each negative half-wave of the alternating voltage and a second reference voltage equal in magnitude and opposite in polarity to the first reference voltage, and linkage means linking the outputs of said two comparators to produce an output voltage representative of the amount by which each alternating voltage half-wave exceeds its associated reference voltage, and wherein at least one of said circuits comprises a current source and an electronically controllable current path connected between said source and said capacitor and having a control input connected to said comparator means for varying the conductance of said current path as a function of the output voltage of said comparator means.

10. In a circuit system for the generation of a direct control voltage dependent upon an alternating voltage for a dynamic compander device, the system including a charging capacitor, a charging circuit connected to charge the capacitor, and a circuit connected to discharge the capacitor, the improvement comprising a first comparator connected to effect comparison between each positive half-wave of the alternating voltage and a first reference voltage, a second comparator connected to effect comparison between each negative half-wave of the alternating voltage and a second reference voltage, and linkage means linking the outputs of said two comparators to produce an output voltage representative of the amount by which each alternating voltage half-wave exceeds its associated reference voltage, and wherein at least one of said circuits comprises a current source and an electronically controllable current path connected between said source and said capacitor and having a control input connected to said comparator means for varying the conductance of said current path as a function of the output voltage of said comparator means, each said comparator comprises two transistors connected to constitute a differential amplifier, means supplying the respective reference voltage to the base of one said transistor, and means supplying alternating voltage to the base of the other said transistor, and said controllable current path is constituted by the emitter-collector path of one of said transistors.

* * * * *